United States Patent [19]

Eiler et al.

[11] Patent Number: 5,493,300
[45] Date of Patent: Feb. 20, 1996

[54] CIRCUIT CONFIGURATION FOR A D/A AND A/D CONVERTER

[75] Inventors: Walter Eiler; Ruediger Gertner, both of Berlin, Germany

[73] Assignee: Eastman Kodak Company, Rochester, N.Y.

[21] Appl. No.: 195,725

[22] Filed: Feb. 14, 1994

[30] Foreign Application Priority Data

May 13, 1993 [DE] Germany ........................ 43 16 080.8

[51] Int. Cl.$^6$ ........................................ H03M 1/00
[52] U.S. Cl. .............................. 341/154; 341/108
[58] Field of Search ........................ 341/154, 144, 341/155, 142, 110; 318/600, 601, 604

[56] References Cited

U.S. PATENT DOCUMENTS

| | | | |
|---|---|---|---|
| 3,569,959 | 3/1971 | Arase | 340/347 |
| 3,731,302 | 5/1973 | Neer | 340/347 AD |
| 3,859,581 | 1/1975 | Gardner | 318/391 |
| 4,141,065 | 2/1979 | Sumi et al. | 364/115 |
| 4,149,256 | 4/1979 | Sumi et al. | 364/602 |

FOREIGN PATENT DOCUMENTS

| | | | |
|---|---|---|---|
| 0002417 | 6/1979 | European Pat. Off. | H03K 13/05 |
| 3012698 | 4/1980 | Germany | B41J 3/04 |
| 90/06652 | 12/1989 | WIPO | B41J 2/05 |

OTHER PUBLICATIONS

"High Print 6200", print head control, p. 4–4, Figure 4–2, Siemens AG 1990.
"High Print 6200", print head control, p. 4–1, Figure 4–1, Siemens AG 1990.

*Primary Examiner*—Brian K. Young
*Attorney, Agent, or Firm*—Milton S. Sales

[57] ABSTRACT

Using only one R2R network, driven by a digital logic, it is possible to implement both a D/A and A/D converter, An existing stabilized voltage $V_{cc}$ is used instead of a separate reference voltage source. The D/A and A/D converter is calibrated with this voltage and an operational amplifier circuited as a comparator. Starting with the known voltage value $V_{cc}$ and the assigned bit combination, it is possible to measure analog voltages from analog voltage sources using further operational amplifiers circuited as comparators.

10 Claims, 1 Drawing Sheet

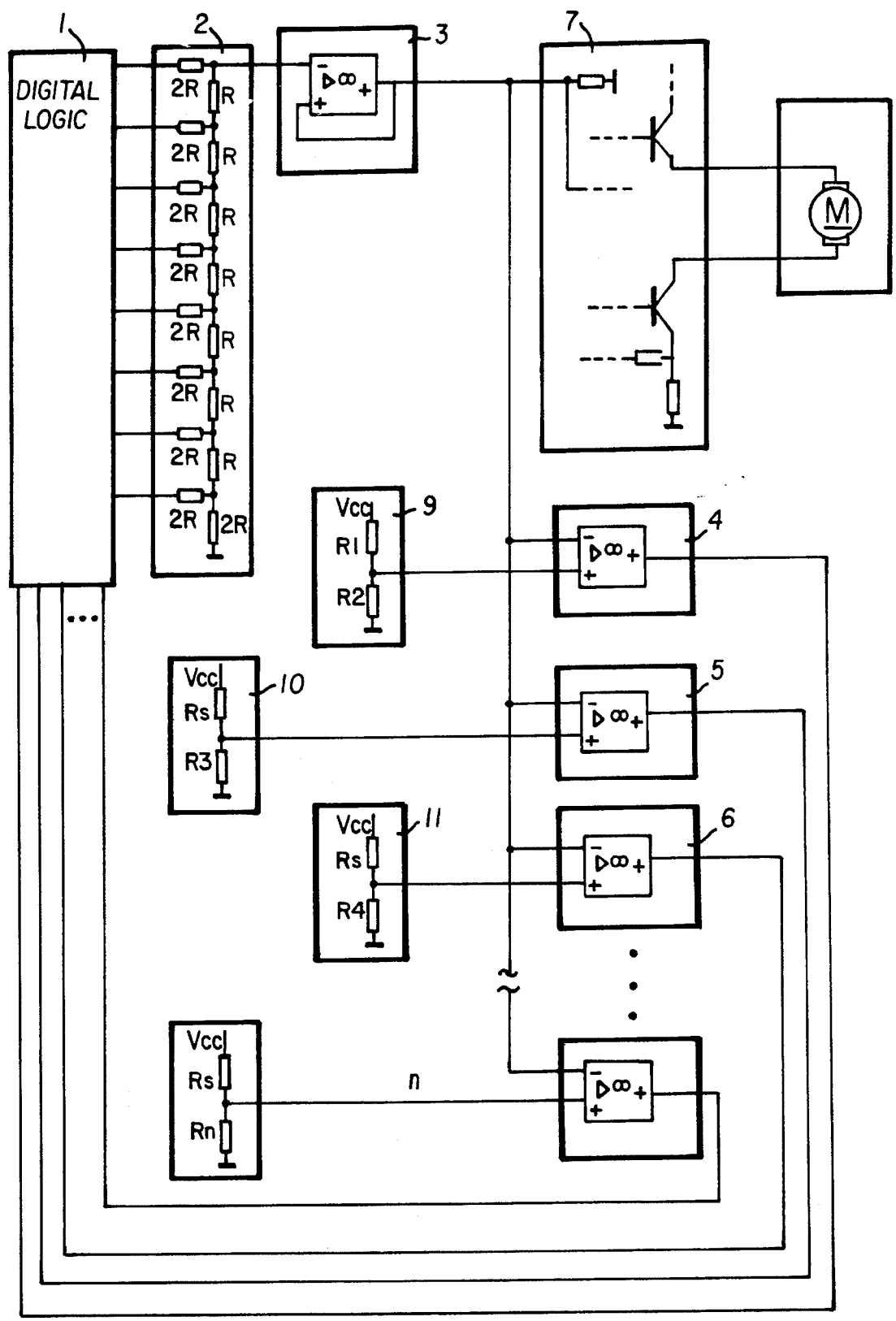

CIRCUIT CONFIGURATION FOR A D/A AND A/D CONVERTER

BACKGROUND OF THE INVENTION

1. Technical Field

The invention relates to a circuit configuration for a digital-to-analog converter and an analog-to-digital converter with an R2R resistive network and voltage comparators, preferably for inkjet printers.

2. Background Art

In modern inkjet printers employing the bubble-jet principle, the ink droplets are generated by heating resistors incorporated into the inkjet print head, see for example, German Patent Publication DE-OS 3 012 698. It is important that the heating pulses lie within given limits in order both to achieve the desired function (i.e., to properly generate ink droplets) and to protect the inkjet print head from damage. Inkjet print heads must not be allowed to get too hot, see, e.g., PCT Patent Publication WO 90/06852. The print head temperature, therefore, has to be monitored. The monitoring is performed using sensors which supply analog voltages corresponding to the temperatures of the print heads. Analog-to-digital (A/D) converters with reference voltage sources and comparators are required to digitally evaluate these voltages, see, e.g., the machine description "High Print 6200" print head control, page 4—4, FIG. 4-2, Siemens AG 1990.

On the other hand, in modern inkjet printers, it is common to use a DC motor controlled by a motor driver circuit for the carriage drive. This motor driver circuit, in turn, receives its control voltage via a digital-to-analog (D/A) converter with an R2R network as well as a reference voltage source and a comparator, see, e.g., the machine description "High Print 6200", print head carriage drive, page 4; see also, the machine description "High Print 6200", print head control, page 4–1, FIG. 4–1, Siemens AG 1990. The precision of the digital-to-analog voltage conversion depends significantly on the precision of the reference voltage. Precision voltage sources, however, are expensive.

Although a common digital logic (e.g., microcontroller, ASIC, discrete logic IC's, etc.) is used for the head control and carriage drive control, the amount of electronics used is still considerable. For cost reasons, a precise reference voltage is therefore dispensed with for the carriage drive control. Instead, the carriage drive control is fed directly with the output voltage from the digital logic—corresponding to TTL or CMOS level. Using this output voltage directly results in inaccuracies of up to 100% which can be compensated with an appropriate degree of control engineering.

SUMMARY OF INVENTION

The object of the invention is to reduce the costs of an inkjet printer without limiting its performance characteristics.

The invention is based on the problem of developing a circuit configuration with which both the A/D conversion for the temperature monitoring of the inkjet print head and the D/A conversion for controlling the print head carriage are possible with sufficient precision and which requires only a single reference voltage source.

Starting from a D/A converter with an R2R network for the carriage drive, this problem is solved as follows. The digital inputs of the R2R network are interfaced to the outputs of a digital logic which is used in any case. The analog output from the R2R network is connected to one input of an operational amplifier. The output of the operational amplifier is coupled with the analog control input of a driver circuit for the carriage drive motor and with one of the inputs of each of the comparators.

The first of these comparators is used for calibrating the D/A converter, for which its second input is connected to a reference voltage source. An already existing stabilized operating voltage source is expediently used for this purpose, preferably that with the most precisely stabilized voltage. The head voltage supply, for example, would be suitable for this purpose. This saves the cost of a separate precision reference voltage supply.

The output of the calibration comparator is connected to one input of the digital logic.

The comparison of the analog output of the operational amplifier with the reference voltage of the reference voltage source indicates the bit combination (i.e., bit value) output by the digital logic at which the digital logic-controlled R2R network supplies an output voltage corresponding to the reference voltage. The comparator switches over (i.e., produces a high signal state) at this bit value.

Thus, a calibration factor of the output voltage from the R2R network is known and is stored by a control program. This once-only comparison by the comparator provides a correction factor which is taken into account by the control program for generating an analog control input for the motor driver circuit and for converting analog outputs of sensors. This makes the D/A converter so accurate that it is suitable for measuring analog values such as the analog values produced by inkjet head temperature sensors, for example.

The second input of the other comparators is connected to assigned analog voltage sources or to sensors. The outputs of these other comparators are coupled with corresponding inputs of the digital logic. The number of these comparators depends on the number of intended measuring points. If, for example, the temperatures of two print heads, i.e., a color head and a mono head, are to be measured, an inexpensive, commercially available 4-way operational amplifier and two PTC thermistors are sufficient as sensors in the solution to which the invention relates.

This method allows both the control and measuring functions in the printer to be performed at very little expense. The control program, executed by a microprocessor, for example, controls this multiple use of the R2R network in a time-division multiplex manner. It will thus be expedient to always perform the temperature monitoring at the reversing points of the carriage travel (i.e., when the analog control input of the motor drive circuit is not critical). Multiplexing the use of the R2R network in this way corresponds to a line-by-line measurement of the head temperature.

As can be easily seen from the description above, the solution to which the invention relates is also suitable for use in other types of machines such as matrix printer, scanner or telefax where similar open-loop and closed-loop control and measuring functions are to be performed.

BRIEF DESCRIPTION OF THE DRAWING

The solution to which the invention relates is described below in more detail using an example in which the solution has already been employed. The figure shows a block circuit diagram of a D/A and A/D converter.

BEST MODE FOR CARRYING OUT THE INVENTION

The digital inputs of an eight-stage R2R network 2 are interfaced to corresponding outputs of a digital logic 1.

The analog output of the R2R network 2 is connected to one input of an operational amplifier 3 which serves as isolation amplifier. The output of operational amplifier 3 is connected to an analog control input of a motor driver circuit 7 and to one input of each of three operational amplifiers circuited as comparators 4, 5, 6. The second input of the comparator 4 is connected via a voltage divider R1, R2 to the head voltage supply serving as the reference voltage source 9. This supplies a sufficiently precise stabilized voltage (+2%). The output of the comparator 4 is connected to an input of the digital logic 1. The second input of the comparator 5 is connected to a sensor 10 for the mono inkjet head and its output is interfaced to one input of the digital logic 1. The second input of the comparator 6 is connected to a sensor 11 for the color inkier head and its output is interfaced to one input of the digital logic 1.

Temporally, the control of the carriage drive via the motor driver circuit 7 occupies the most control program time (recall that the control program only measures inkjet head temperature during carriage returns). For this, a variable DC voltage corresponding to the desired motor speed must be connected to the control input of the circuit. The information on the desired motor speed is received by the digital logic 1 from an encoder (not shown). The output port of the digital logic 1 has eight outputs for controlling the 8-bit wide R2R network 2. If a four-way operational amplifier is used for measuring the analog signals provided by the mono inkjet head sensor 10 and the color inkjet head sensor 11, the input port of the digital logic 1 must have three inputs. The operational amplifier 3, circuited as an isolation amplifier, supplies the low-ohmic voltage for the motor driver circuit 7 at the output of R2R network 2.

The level of the voltage supplied by the operational amplifier 3 is determined by the bit pattern output by the digital logic 1. However, this voltage depends not only on the bit pattern but also on the output level of the corresponding digital logic 1. With a TTL output, this can be between 2.4 V and almost 5 V for high level.

If the motor current limit in the motor driver circuit 7 is used, then this limit would have to assume the highest possible output level of the corresponding digital logic 1 (e.g., "11111111"). In this case, however, the current of the carriage drive in the production series would then generally be lower than actually desired and required.

The use of a comparator 4 enables the output voltage of the output ports to be determined for each digital logic 1 by comparison with a known reference voltage (either operating voltage 5 V or head voltage 35 V). For this, the program determines the bit value output by digital logic 1 at which the comparator 4 switches over (i.e., produces a high state). As this bit value corresponds to a fraction of the reference voltage 9—according to the voltage divider—the program can be used to calculate the voltage obtained from the R2R network for any bit combination below this bit value.

The motor current limit in the motor driver circuit now depends on the guaranteed minimum high level of the digital logic. Expediently, the input voltage and the fraction of the reference voltage 9 required should have the value of the guaranteed minimum high level of the digital logic 1.

Since, from the comparison with the known precise voltage $V_{cc}$, the output voltage of the R2R network is now known exactly for all bit combinations, comparisons with any analog voltages—and thus also correspondingly precise measurements—are possible using comparators 5 and 6. For this purpose sensors 10, 11 are connected, via the dedicated resistors R3, R4, as voltage dividers to the assigned input of operational amplifiers 5, 6. If the resistor R3, R4 is connected to the same voltage $V_{cc}$ as the operational amplifier 4 for calibration, then all voltage dividers use the same reference voltage, thus minimizing the tolerances for this measurement. This then permits other analog voltages to be very accurately measured. It must merely be noted that the analog voltage to be measured at the comparator input must not exceed the maximum output voltage of the digital logic. This can be assured, however, by appropriately dimensioning the voltage dividers.

If the sensors are designed as active voltage sources, the voltage dividers can be omitted.

The invention has been described in detail with particular reference to a certain preferred embodiment thereof, but it will be understood that variations and modifications can be effected within the spirit and scope of the invention.

What is claimed is:

1. A digital-to-analog and analog-to-digital converter circuit configuration for a motor driver circuit; said converter circuit configuration comprising:

a digital logic having a plurality of inputs and a plurality of outputs;

an R2R network having a plurality of inputs interfaced to the outputs of said digital logic and having an output;

a plurality of voltage comparators, each comparator having an output respectively connected to one of the inputs of said digital logic, and first and second inputs;

an operational amplifier linking the output of said R2R network to the motor driver circuit and to the first inputs of the voltage comparators;

a plurality of operating voltage sources, one of said operating voltage sources being connected to the second input of one of said voltage comparators as a reference voltage source for calibration, and those of the operating voltage sources other than the one of said operating voltage sources being respectively connected to the second inputs of those of the voltage comparators other than the one of said voltage comparators.

2. The digital-to-analog and analog-to-digital converter circuit configuration as defined in claim 1 wherein the operating voltage sources differ in stability, and the most stable of the operating voltage sources is used as said reference voltage source.

3. The digital-to-analog and analog-to-digital converter circuit configuration as defined in claim 1 wherein said operating voltage sources are analog voltage sources.

4. The digital-to-analog and analog-to-digital converter circuit configuration as defined in claim 1 wherein each one of said plurality of voltage comparators comprises one operational amplifier.

5. A device for providing an analog output signal and for accepting at least one digital input signal, the device comprising:

a) a digital logic circuit having a calibration input, at least one digital input, a control input, and digital control outputs;

b) a digital-to-analog converter having digital inputs coupled with the digital control outputs of the digital logic circuit and having an analog output for providing the analog output signal;

c) a plurality of comparators including a first comparator and a second comparator, the first comparator having a first input coupled with the analog output of the digital to analog converter, a second input coupled with a reference voltage source, and an output coupled with the calibration input of the digital logic circuit, and the second comparator having a first input coupled with the analog output of the digital to analog converter, a second input provided with an analog sensor signal, and an output coupled with one of the at least one digital input of the digital logic circuit.

6. The device of claim 5 further comprising a processor for running a control program, the control program, in conjunction with the processor, controls the digital logic circuit to provide a first type of digital control outputs during a first time slot and a second type of digital control outputs during a second time slot.

7. The device of claim 6 wherein the first type of digital control outputs is a motor drive output and the second type of digital control outputs is a sensor threshold output.

8. The device of claim 7 wherein the second time slot occurs during carriage returns and the first time slot occurs between carriage returns.

9. The device of claim 5 wherein the reference voltage source is a voltage supply for a ink jet head.

10. The device of claim 5 wherein the digital to analog converter includes an R2R network.

\* \* \* \* \*